US008774910B2

(12) United States Patent
Park et al.

(10) Patent No.: US 8,774,910 B2
(45) Date of Patent: Jul. 8, 2014

(54) POLYMER LINEAR ACTUATOR FOR MICRO ELECTRO MECHANICAL SYSTEM AND MICRO MANIPULATOR FOR MEASUREMENT DEVICE OF CRANIAL NERVE SIGNAL USING THE SAME

(75) Inventors: Suk-ho Park, Seoul (KR); Jin-seok Kim, Seoul (KR); Ju-hee Hong, Ulsan (KR); Sung-wook Yang, Seoul (KR); Hee-sup Shin, Gyeonggi-do (KR); Dong-won Lee, Gwangju (KR); Suk-chan Lee, Daejeon (KR); Hui-su Kim, Seoul (KR); Eui Sung Yoon, Seoul (KR)

(73) Assignee: Korea Institute of Science and Technology, Seoul (KR)

(*) Notice: Subject to any disclaimer, the term of this patent is extended or adjusted under 35 U.S.C. 154(b) by 735 days.

(21) Appl. No.: 13/017,336

(22) Filed: Jan. 31, 2011

(65) Prior Publication Data
US 2011/0190859 A1   Aug. 4, 2011

Related U.S. Application Data

(62) Division of application No. 11/512,340, filed on Aug. 30, 2006, now Pat. No. 7,917,200.

(30) Foreign Application Priority Data

Mar. 29, 2006   (KR) .......................... 10-2006-0028250

(51) Int. Cl.
*A61B 5/04*   (2006.01)

(52) U.S. Cl.
USPC ........... 600/544; 600/545; 310/363; 310/800; 310/365; 310/330

(58) Field of Classification Search
USPC ........... 600/544–545; 310/363, 365, 330, 800
See application file for complete search history.

(56) References Cited

U.S. PATENT DOCUMENTS

| 7,259,503 B2 * | 8/2007 | Pei et al. ........................ 310/363 |
| 2004/0232807 A1 * | 11/2004 | Pelrine et al. .................. 310/800 |

FOREIGN PATENT DOCUMENTS

| JP | 10-337061 | 12/1998 |
| JP | 2004-314219 A | 11/2004 |
| JP | 2004314219 A * | 11/2004 |

OTHER PUBLICATIONS

European Search Report issued in European Patent Application No. 06291330.6-1528, dated Dec. 29, 2010.

* cited by examiner

*Primary Examiner* — Michael D'Angelo
(74) *Attorney, Agent, or Firm* — McDermott Will & Emery LLP

(57) ABSTRACT

A polymer linear actuator for a micro electro mechanical system (MEMS) and a micro manipulator for a measurement device of cranial nerve signal using the same are provided. The polymer linear actuator has first and second bodies positioned spaced apart to a distance from each other, and one or more pairs of V-type moving units connecting the first and second bodies together, wherein the moving units in pair are opposed to each other to convert a rotation motion of the respective moving units into a linear motion, thereby causing the first and second bodies to move linearly.

3 Claims, 16 Drawing Sheets

FIG. 10

|   | FIRST CLAMP ACTUATOR | SECOND CLAMP ACTUATOR | DRIVE ACTUATOR |
|---|---|---|---|
| 1 | ON | ON | OFF |
| 2 | OFF | ON | OFF |
| 3 | OFF | ON | ON |
| 4 | ON | ON | ON |
| 5 | ON | OFF | ON |
| 6 | ON | OFF | OFF |

POLYMER LINEAR ACTUATOR FOR MICRO ELECTRO MECHANICAL SYSTEM AND MICRO MANIPULATOR FOR MEASUREMENT DEVICE OF CRANIAL NERVE SIGNAL USING THE SAME

CROSS-REFERENCE TO RELATED APPLICATIONS

This application is a Divisional of U.S. patent application Ser. No. 11/512,340, filed on Aug. 30, 2006, now U.S. Pat. No. 7,917,200, and claims all benefits of Korean Patent Application No. 10-2006-28250, filed on Mar. 29, 2006 in the Korean Intellectual Property Office, the disclosures of each of which application is incorporated herein by reference.

BACKGROUND OF THE INVENTION

1. Field of the invention

The present invention relates to a polymer linear actuator for a micro electro mechanical system (hereinafter referred to as "MEMS") and a micro manipulator for a measurement device of a cranial nerve signal using the same, and more particularly to an actuator linearly moving using the thermal expansion of polymer and a micro manipulator for a measurement device of a cranial nerve signal using the same.

2. Description of the Prior Art

As a conventional MEMS type actuator, an actuator using an electrostatic force has been generally used. The MEMS type actuator using an electrostatic force has an advantage in the formation of micro size of such as a micro pattern and the reproducibility thereof through in general using a semiconductor manufacturing process. Such electrostatic actuator has a high response speed and is suitable for the application where to require rapid driving.

The MEMS type linear actuator using an electrostatic force is classified into a type using just an operation manner of a macro scale linear actuator, a type using a inchworm's motion, and a type to improve a displacement through the movement of unrestricted shuttle to overcome a small displacement that is one of the problems of the MEMS type actuator.

However, the conventional electrostatic MEMS type linear actuator has problems of very high operation voltage and a relatively small driving force, in comparison to other type actuator.

Meanwhile, an MEMS type actuator using polymer has also been developed. Such MEMS type polymer rotation actuator has been shown in FIG. 1.

Referring to FIG. 1, the conventional MEMS type polymer rotation actuator 1 includes a base 3, a silicon plate 5 installed on the base 3, and a moving part 7. The moving part 7 is made of silicon like the plate 5 and the two parts are divided by a polymer layer 9. The polymer layer 9 defines the boundary of the moving part 7 and the polymer multi-layers may be installed according to a rotation angle of the moving part 7. The moving part 7 rotates in an arrow direction with the thermal expansion or contraction through the heating or cooling of the polymer layer 9. The rotation movement of the moving part 7 is shown in detail in FIG. 2.

FIG. 2 is an enlarged view of a section A of FIG. 1. In FIG. 2, the polymer layers 9 are installed on the moving part 7 wherein an uncured condition of the polymer layers is indicated in an imaginary line. At this time, when the polymer layers 9 are cured, the moving part 7 is curved and rotated by the contraction thereof as indicated in a solid line. In particular, the lengths a' and b' of the upper and lower sides, respectively, of the inverse trapezoid of the polymer layer 9 are reduced to the lengths a and b, respectively, due to its cure. At this time, since the contraction of the upper side of the polymer layer in inverse trapezoidal shape is larger than that of the lower side thereof, the moving part 7 rotates upward by the contraction difference therebetween. The amount of rotation can be regulated with the variation of the number of the polymer layers 9 installed. Accordingly, upon application of heat to the polymer layer 9 cured as shown in solid line, on the contrary, the polymer layer 9 expands so that the moving part 7 rotates in the left side along an arrow direction due to the contraction difference between the upper and lower sides. However, the conventional actuator using the polymer layer can only rotate, but cannot move linearly.

SUMMARY OF THE INVENTION

Accordingly, the present invention has been made to solve the above-mentioned problems occurring in the prior art, and an object of the present invention is to provide a polymer linear actuator to realize a linear motion using the thermal expansion and contraction of polymer.

Another object of the present invention is to provide a polymer linear actuator having a strong driving force through the thermal expansion of polymer.

In order to accomplish the above objects, there is provided a polymer linear actuator for a micro electro mechanical system (MEMS), comprising: first and second bodies positioned spaced apart to a distance from each other; and one or more pairs of V-type moving units connecting the first and second bodies together, wherein the moving units in pair are opposed to each other to convert a rotation motion of the respective moving units into a linear motion, thereby causing the first and second bodies to move linearly.

Herein, the moving units in pair may include a polymer joint part having a trapezoid in cross-sectional shape, a pair of silicon drive members whose one ends are connected to the hypotenuses of the trapezoid of the polymer joint part, a polymer connector part for connecting the other ends of the silicon drive members to the first or second body, or to the adjacent pair of moving units, a resistor part applying heat to the polymer joint part and the polymer connector part, and a power supply for supplying electric power to the resistor part, wherein the polymer joint part and the polymer connector part expand or contract with the heat selectively applied from the resistor part to allow the drive members of the respective moving units to rotate, thereby causing the first and second bodies to move linearly.

Here, the resistor part may be an electrode line patterned in zigzag pattern on the surfaces of the polymer joint part and the polymer connector part.

Here, the drive member may be connected to the polymer joint part by connection means including a wedge protrusion provided on an inclined plane of the polymer joint part and a recess provided on the drive member connected to an inclined plane of the polymer joint part and corresponding to the shape of the protrusion, such that the protrusion is inserted into the recess to connect the drive member and the polymer joint part together.

In accordance with another embodiment of the present invention, there is provided a polymer linear actuator for a micro electro mechanical system (MEMS), comprising: first and second bodies positioned spaced apart to a distance from each other; bar type polymer connection parts connecting the first and second bodies together; silicon drive members disposed in a trapezoidal shape along the polymer connection parts; a resistor part applying heat to the polymer connection parts; and a power supply for supplying electric power to the resistor part, wherein the polymer connection parts expand or contract with the heat selectively applied from the resistor part to cause the first and second bodies to move linearly.

Here, the silicon members may be connected to the polymer connection parts by connection means including at least one wedge protrusions provided on the polymer connection parts contacting the silicon members and at least one recesses provided on the silicon members and corresponding to the shape of the protrusions, such that the protrusions are inserted into the recesses to connect the silicon members and the polymer connection parts together.

In accordance with another aspect of the present invention, there is provided a micro manipulator of a measurement device of a cranial nerve signal for detecting an electric signal of the cranial nerves or linearly moving an electrode applying an electric signal to the cranial nerves, the micro manipulator comprising: first and second guide members installed spaced to a distance from each other; first and second clamp actuators spaced to a distance between the first and second guide members and installed perpendicular to a movement direction of the electrode; and a drive actuator installed parallel to the movement direction of the electrode and between the first and second clamp actuators, wherein the respective actuators are the polymer linear actuators.

BRIEF DESCRIPTION OF THE DRAWINGS

The above and other objects, features and advantages of the present invention will be more apparent from the following detailed description taken in conjunction with the accompanying drawings, in which:

FIG. 10 is a table showing an order of applying an electric power to the respective actuators in a drive method of a micro manipulator according to a preferred embodiment of the present invention.

DETAILED DESCRIPTION OF THE PREFERRED EMBODIMENTS

Hereinafter, preferred embodiments of the present invention will be described with reference to the accompanying drawings.

Figure 1:
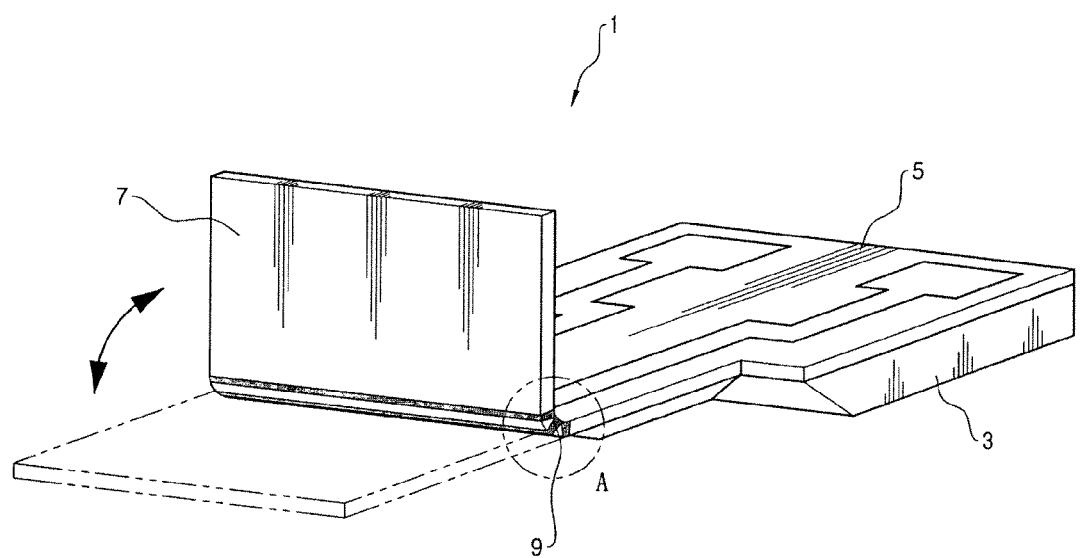
FIG. 1 is a perspective view of a conventional polymer rotation actuator for a micro electro mechanical system (MEMS)
Figure 2:
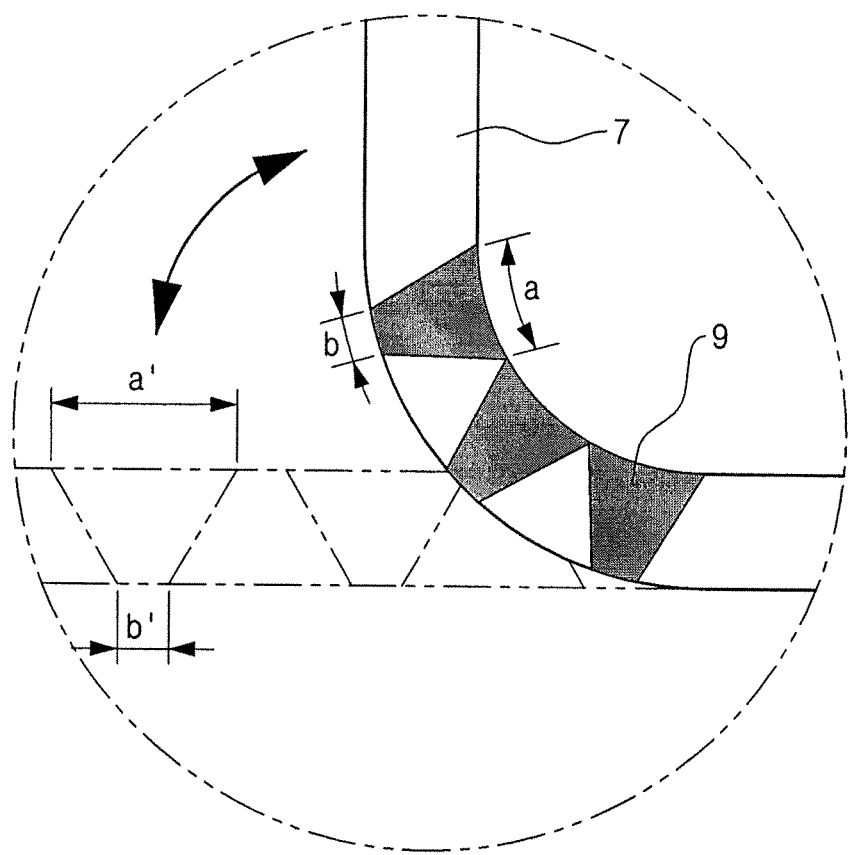
FIG. 2 is an enlarged view of a section A of FIG. 1.
Figure 3:
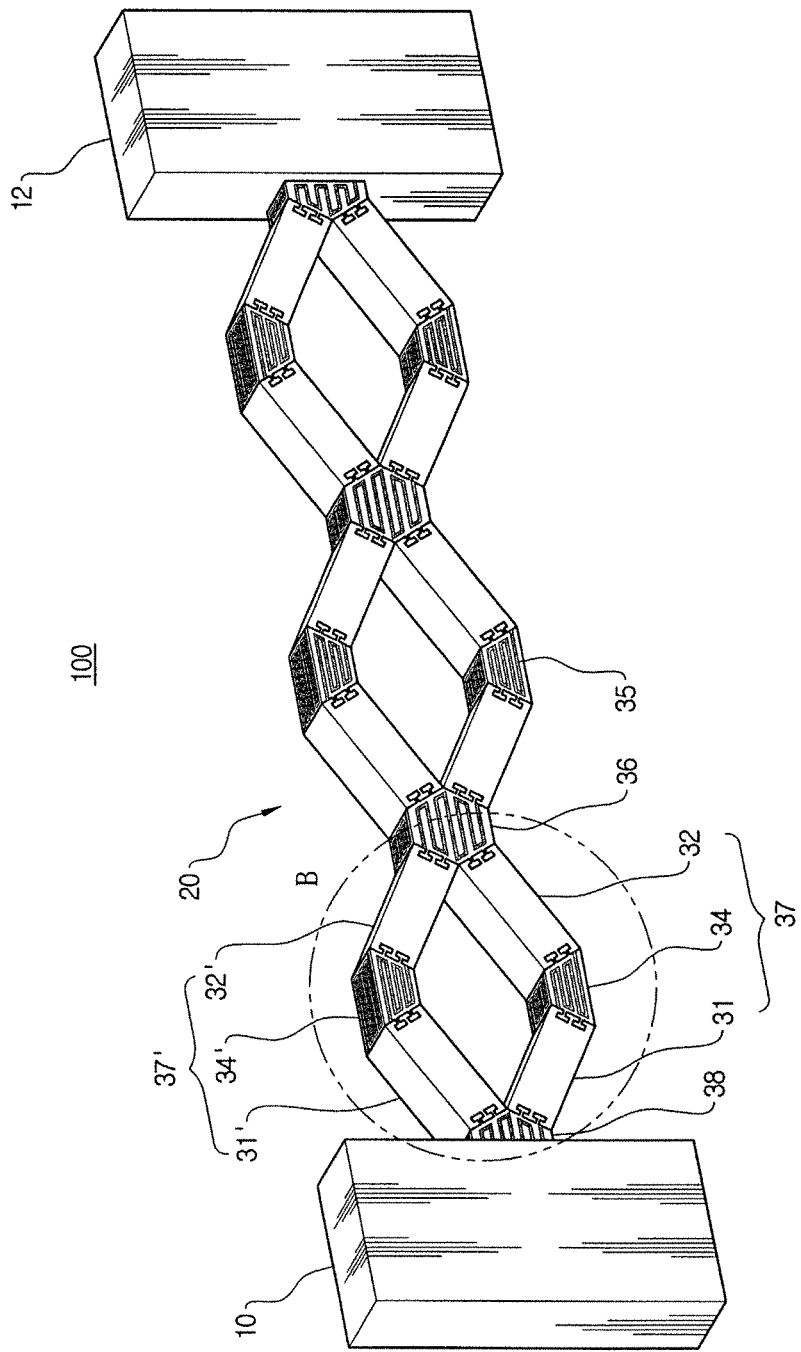
FIG. 3 is a perspective view of a polymer linear actuator for a micro electro mechanical system (MEMS) according to a preferred embodiment of the present invention.
Figure 4:
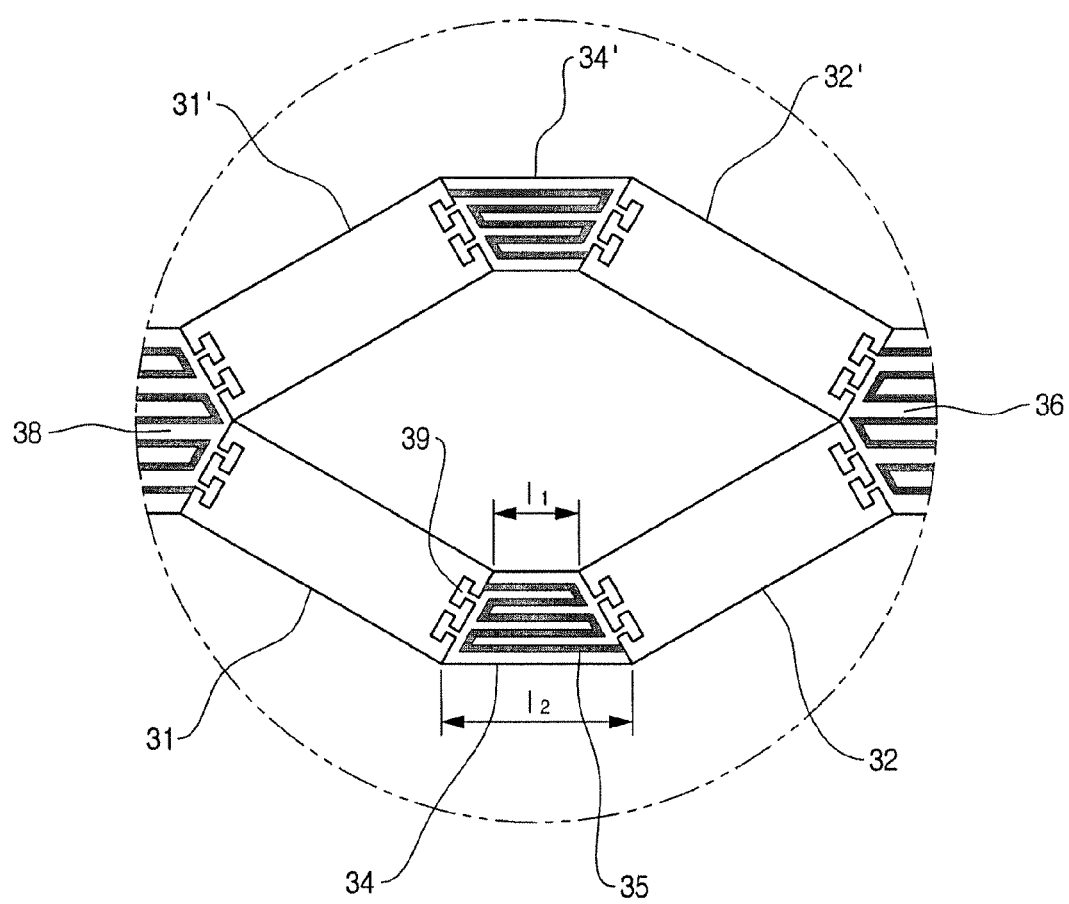
FIG. 4 is an enlarged view of a section B of FIG. 3.

FIG. 3 is a perspective view of a polymer linear actuator for a micro electro mechanical system (MEMS) according to a preferred embodiment of the present invention, and FIG. 4 is an enlarged front view of a section B of FIG. 3.

Referring to FIG. 3, the MEMS type polymer linear actuator 100 of the present invention includes the first and second bodies 10 and 12 positioned spaced to a distance from each other, and a drive part 20 connecting the first and second bodies 10 and 12 together and driven in a contraction motion or an expansion motion.

In the present invention, the material of the first and second bodies 10 and 12 is not limited, but may be various kinds of materials, such as silicon, preferably.

The drive part 20 connects the first and second bodies 10 and 12 together and moves in a contraction motion and a thermal expansion motion to cause the bodies to move linearly. In the present invention, the drive part 20 includes one or more pairs of V-type moving units 37 and 37', each pair of moving units 37 and 37' being disposed opposite to each other. Accordingly, the rotation movement of the moving units 37 and 37' in pair is converted into a linear movement to cause the first and second bodies 10 and 12 to move linearly. A movement operation will be described in detail as follows:

One or more pairs of the moving units connecting the first and second bodies 10 and 12 includes a V-type first moving unit 37 and a second moving unit 37' opposed to the first moving unit 37, thereby forming a trapezoidal shape in whole.

As shown in FIG. 4, the first moving unit 37 includes a first silicon drive member 31 whose one end is connected to the hypotenuse of a first polymer connector part 38 installed on the side of the first body 10, a polymer joint part 34 whose one end is connected to the other end of the first silicon drive member 31, a second silicon drive member 32 connected to the other end of the polymer joint part 34, a second polymer connector part 36 connecting the other end of the second silicon drive member 32 to adjacent pair of moving units, a resistor part 35 applying heat to the polymer joint part 34 and the first and second polymer connector parts 36 and 38, and a power supply (not shown) for supplying electric power to the resistor part. Herein, as shown in the drawing, the polymer joint part 34 has a trapezoidal shape in cross-section to which both hypotenuses the first and second polymer connector parts 31 and 32 are connected, respectively. Meanwhile, the resistor part 35 heating the polymer joint part 34 and the first and second polymer connector parts 36 and 38 is patterned on the surfaces of the polymer joint part 34 and the polymer connector parts 36 and 38 through a metallic patterning (a metal deposition and a photolithography) in a manufacturing process. The metallic patterning is well known by the skilled persons in the art so the detailed description thereof will be omitted. In the present invention, in order to improve heat transfer and the efficiency thereof through the resistor part 35, the silicon drive members 31 and 32 are provided only with an electrode line (not shown) thereon required for electric connection, while the polymer joint part 34 and the polymer connector parts 36 and 38 are provided with the resistor part 35 formed in zigzag shape for increasing resistance.

As shown in FIG. 4, the second moving unit 37' opposed to the first moving unit 37 is symmetrical with the first moving unit 37 so the detailed description thereof will be omitted.

The first and second moving units 37 and 37' having above construction can be connected with adjacent pair of moving units by the polymer connector part 36, and the quantity of one linear motion of the actuator of the present invention can be regulated by the number of serial connections of the pairs of the first and second moving units. In FIGS. 4, $l_1$ and $l_2$ denote the lengths of the upper and lower sides, respectively, of the trapezoidal shape of the polymer joint part 34.

In the first moving unit 37, wedge protrusions 39 are provided on the surfaces of the polymer connector parts 36 and 38 and polymer joint part 34 contacting the silicon drive members 31 and 32, and recesses corresponding to the wedge protrusions are provided on the corresponding surfaces of the silicon drive members 31 and 32. Accordingly, when the silicon drive members 31 and 32 in pair are connected between the first and second polymer connector parts 36 and 38 and the polymer joint part 34, the wedge protrusions are inserted into the recesses of the silicon drive members 31 and 32 to securely connect them together.

Figure 5:
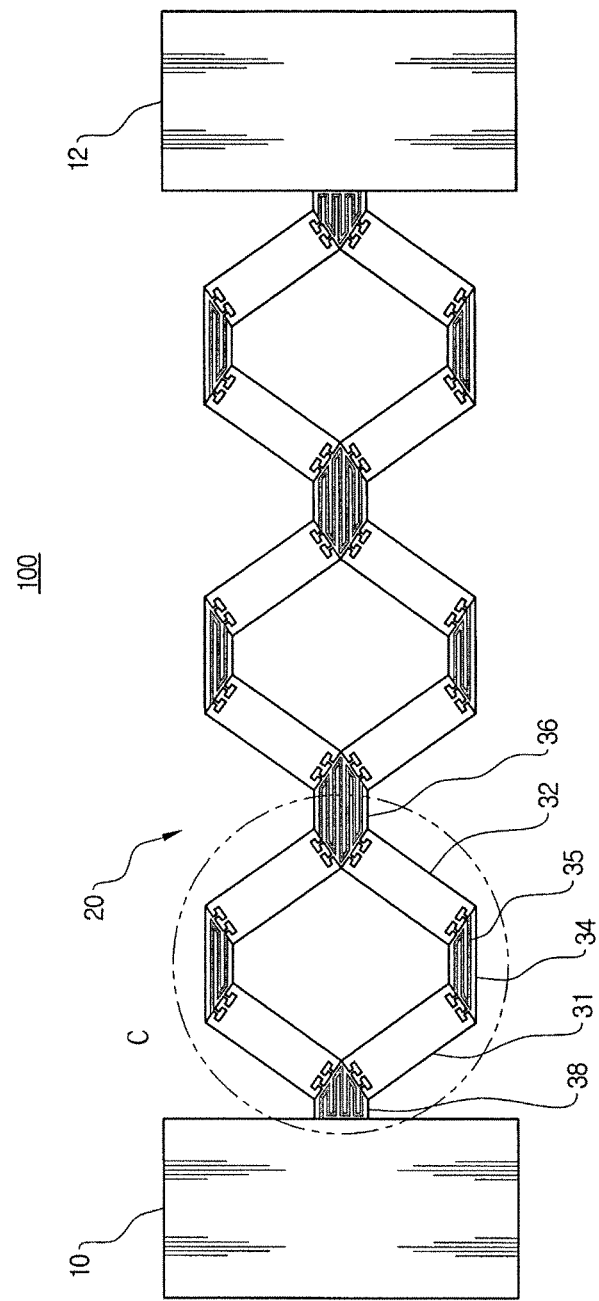
FIG. 5 is a front view illustrating a state where the polymer linear actuator of FIG. 3 is contracted through heating.
Figure 6:
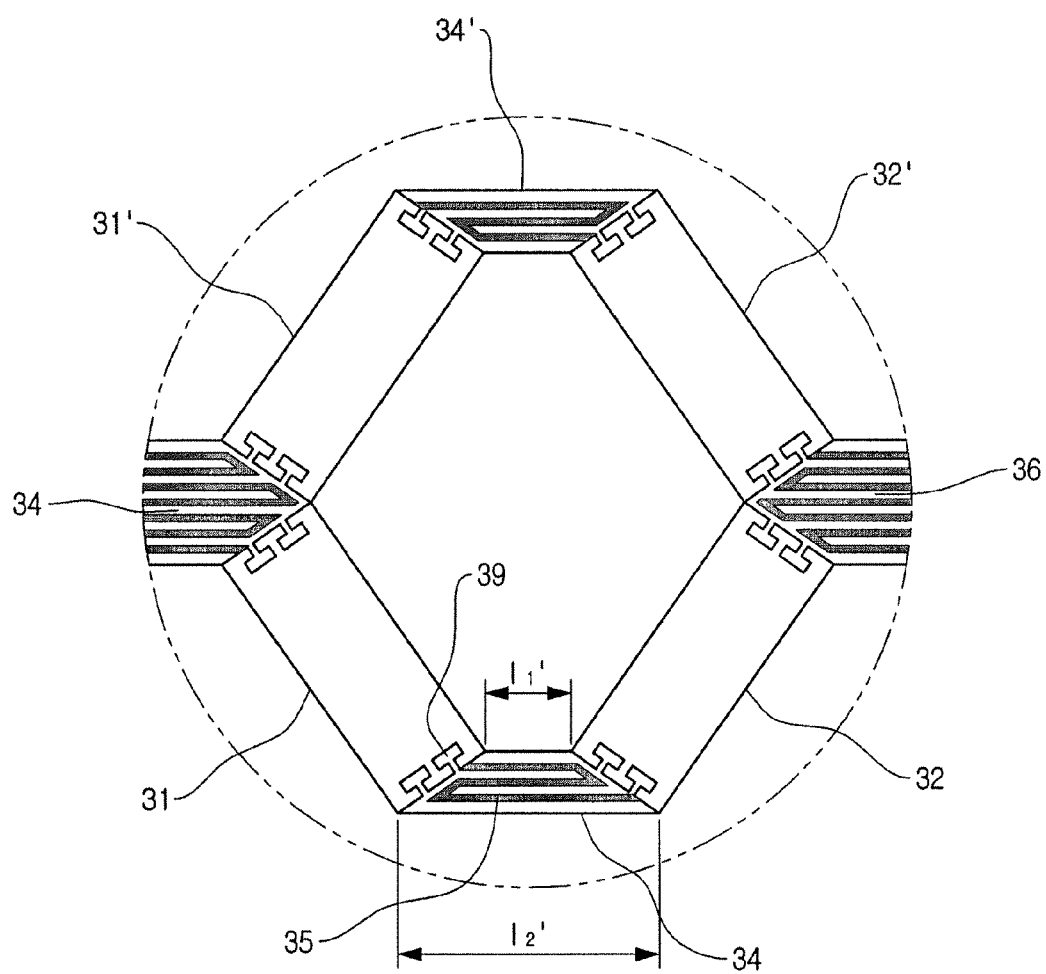
FIG. 6 is an enlarged view of a section C of FIG. 5.

FIG. 5 shows a state that the linear actuator 100 has moved linearly in contracted motion through applying heat to the polymer joint parts 34 and the polymer connector parts 36 of the linear actuator 100 of FIG. 3 using the resistor part 35, and FIG. 6 is an enlarged view of a section C of FIG. 5.

Referring to FIGS. 5 and 6, when the polymer joint part 34 and the respective polymer connector parts 36 and 38 of the first moving unit 37 is heated by the resistor part 35, the polymer expands so that as shown in the drawing, the lengths $l_1'$ and $l_2'$ of the upper and lower sides of the polymer joint part 34 increase as compared with the lengths $l_1$ and $l_2$ in FIG. 3. In this case, as described before, in FIG. 6, the silicon drive member 31 connected to the left side of the polymer joint part 34 rotates clockwise and the silicon drive member 32 connected to the right side of the polymer joint part 34 rotates counterclockwise due to the difference between length increments of the upper and lower sides, with the result that an angle between the silicon members 31 and 32 in pair is reduced.

The angular variation between the silicon drive members by the thermal expansion will also occur in the second moving unit 37'. That is, through the similar process to above, an angle between the silicon drive members 31' and 32' in pair of the second moving unit 37' is reduced.

Accordingly, the silicon drive members 31 and 32 of the first moving unit 37 and the silicon drive members 31' and 32' of the second moving unit 37' respectively extend toward each other in vertical direction in FIG. 6, so that a distance between the first and second polymer connector parts 38 and 36, and therefore a distance between the first and second bodies 10 and 12 are reduced. Such distance variation between the first and second polymer connector parts 38 and 36 is apparent when comparing FIGS. 4 and 6 with each other. As a result, if only one of first and second moving units 37 and 37' is disposed, the respective drive members move in a linear motion together with a rotation motion, but if the second moving unit is disposed symmetrically opposite to the first moving unit 37, the rotation motions of the respective moving units are offset each other so that the respective moving units move in a linear motion.

In this way, as shown in FIG. 5, through the application of heat to the polymer joint part 34 and the polymer connector parts 36 and 38, the first and second bodies 10 and 12 move nearer toward each other in a contraction motion by the thermal expansion of polymer, and through cooling the polymer joint part 34 and the polymer connector parts 36 and 38 to cure polymer again, as shown in FIG. 3, the first and second bodies 10 and 12 move apart from each other in a relaxation motion by the contraction of polymer. Accordingly, with the selective heating of the polymer joint part 34 and the polymer connector parts 36 and 38, an operator can regulate a linear motion of the polymer linear actuator 100 of the present invention. When it is required to regulate the quantity of one time linear motion of the polymer linear actuator 100, it needs only to change the number of serial connections of the pairs of the first and second moving units 37 and 37' between the first and second bodies 10 and 12.

Figure 7:
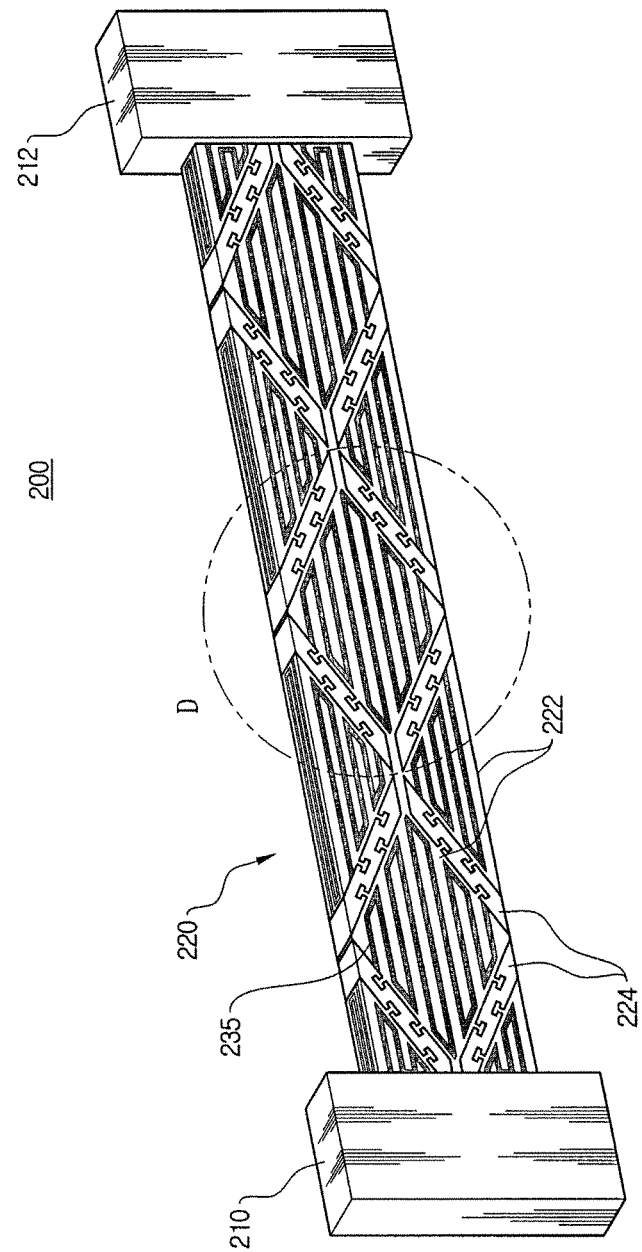
FIG. 7 is a perspective view of a polymer linear actuator for a micro electro mechanical system (MEMS) according to another preferred embodiment of the present invention.
Figure 8:
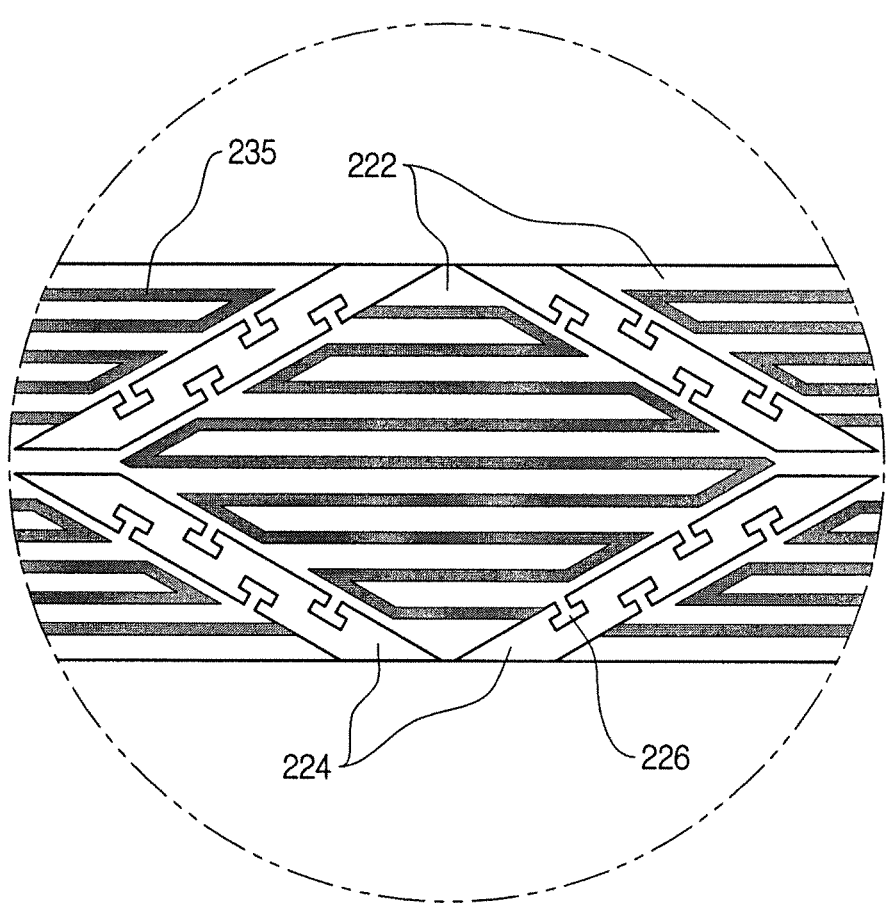
FIG. 8 is an enlarged view of a section D of FIG. 7.

FIG. 7 is a perspective view of a polymer linear actuator 200 according to another preferred embodiment of the present invention, and FIG. 8 is an enlarged view of a section D of FIG. 7.

Referring to FIGS. 7 and 8, the linear actuator 200 according to the embodiment of the present invention is different from that of the former embodiment in a structure of a drive part 220 connecting the first and second bodies 210 and 212 and moving in a linear motion.

In FIGS. 7 and 8, the polymer linear actuator 200 is different from that of FIG. 3 in that the drive part 220 includes bar type polymer connection parts 222 connecting the first and second bodies 210 and 212 together, and silicon drive members 224 disposed in at least one trapezoid along a length direction of the polymer connection parts 222.

The silicon drive members 224 are disposed to form a trapezoidal shape as a whole in a length direction of the polymer connection parts 222. The silicon drive members 224 form at least one set of trapezoidal drive members. Similar to the embodiment of FIG. 3, the silicon drive member 224 and the polymer connection part 222 are provided with recesses and wedge protrusions, respectively, to securely connect them 224 and 222 with each other.

In the above drive part 220, when the polymer connection parts 222 are heated by a resistor part 235, polymer expands by heat to increase a distance between the first and second bodies 210 and 212, and when the polymer connection parts 222 are cooled to cure, the polymer connection parts contract to reduce a distance between the first and second bodies 210 and 212. Accordingly, through the selective heating of the polymer connection parts 222, an operator can regulate a linear motion of the polymer linear actuator 200.

Figure 9:
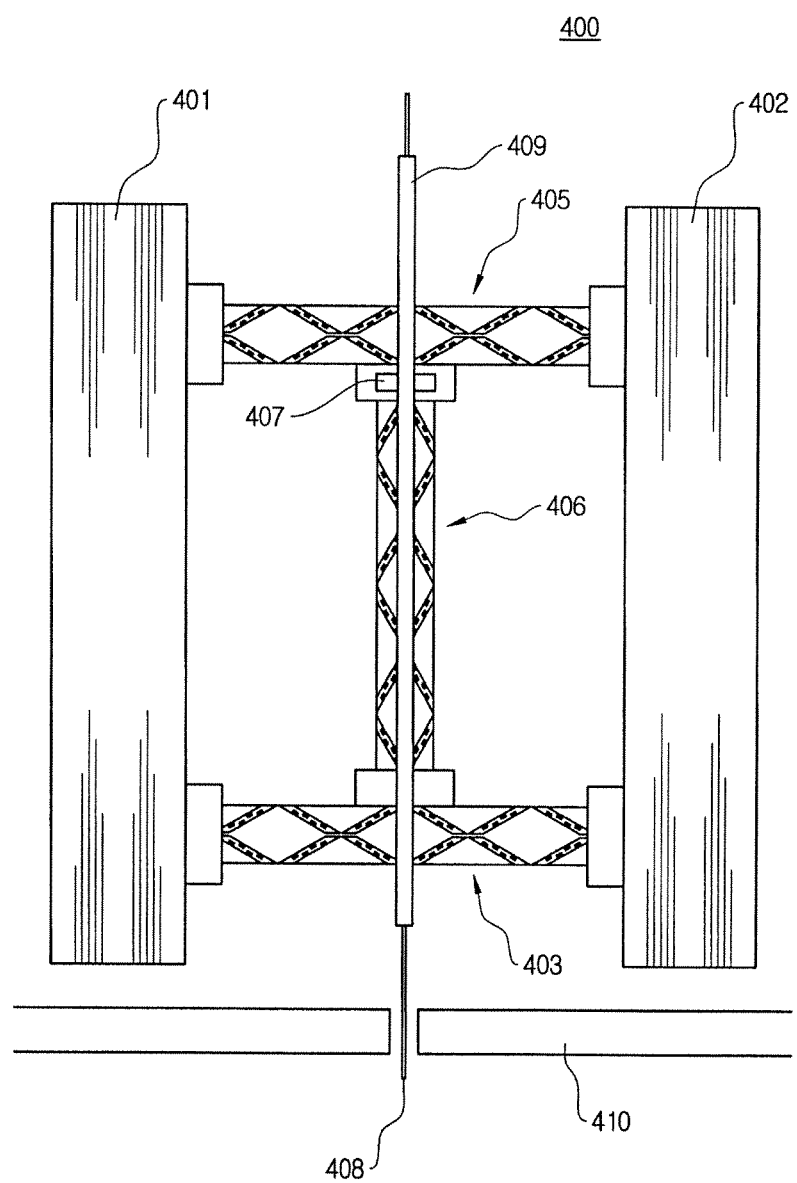
FIG. 9 is a view illustrating a construction of a micro manipulator of a measurement device for a cranial nerve signal, using a polymer linear actuator for an MEMS.

FIG. 9 is a view illustrating a construction of a micro manipulator of a measurement device for a cranial nerve signal, using the polymer linear actuator of the present invention. Herein, the measurement device of a cranial nerve signal is a device for use in an experiment for figuring out correlation between the cranial nerves and the electricity, which device includes an electrode 408 serving to detect an electric signal of the cranial nerves or to apply an electric signal to the cranial nerve cells, a micro-manipulator 400 serving to move the electrode 408 nearer to the cranial nerve cells through a skull 410, and a signal processor (not shown) for converting an electric signal from the electrode 409 into a digital signal and analyzing the same. Such manipulator 400 serves to slightly move the electrode 408 nearer to or away from the cranial nerve cells. The manipulator 400 of FIG. 9 controls the movement of the electrode 408 using the polymer linear actuator of the present invention.

Referring to FIG. 9, the micro manipulator 400 of the present invention includes the first and second guide members 401 and 402 installed spaced apart to a distance from each other, the first and second clamp actuators 403 and 405 installed perpendicular to the movement direction of the electrode 408 between the first and second opposed guide members 401 and 402, a drive actuator 406 whose both ends are respectively connected to the opposite faces of the first and second clamp actuators 403 and 405, and an electrode holder 409 installed in parallel on the drive actuator 406 and in which the electrode 408 is inserted and fixed. The first and second clamp actuators 403 and 405 can adopt the polymer linear actuator according to another embodiment of the present invention as described in FIG. 7. That is, as set forth before, the first and second clamp actuators 403 and 405 contract and expand perpendicular to the movement direction of the electrode 408 according to the thermal expansion of polymer through the application of electric power, and the drive actuator 406 contracts and expands in parallel to the movement direction of the electrode 408 according to the thermal expansion of polymer through the application of electric power. While the embodiment of FIG. 9 adopts the polymer linear actuator 200 of FIG. 7, it is not limited thereto, but may adopt the polymer linear actuator 100 of FIG. 3.

The first and second guide members 401 and 402 are made of proper material with suitable strength, and the respective actuators are disposed therebetween. The first and second guide members 401 and 402 serve to guide the movement of the respective actuators.

The first and second clamp actuators 403 and 405 and the drive actuator 406 are disposed between the first and second guide members 401 and 402. In particular, the first and second clamp actuators 403 and 405 are disposed perpendicular to the predetermined movement direction of the electrode 408, i.e., horizontally in FIG. 9, between the opposite faces of the first and second guide members 401 and 402. As described before, the first and second clamp actuators 403 and 405 expand through the application of heat by the power source, and contract through the cut off of the power source. Accordingly, upon the expansion through the application of power to the first and second clamp actuators 403 and 405, the both ends thereof bring in contact with and are fixed to the opposite faces of the first and second guide members 401 and 402. On the contrary, upon the contraction through the cut off of power from the first and second clamp actuators 403 and 405, the both ends thereof move away and are separated from the faces of the first and second guide members 401 and 402.

Meanwhile, the drive actuator 406, as shown in FIG. 9, is disposed in parallel to the predetermined movement direction of the electrode 408, i.e., perpendicular in FIG. 9, between the opposite faces of the first and second clamp actuators 403 and 405. Accordingly, upon the application of power to the drive actuator 406, the drive actuator 406 expands to move the first and second clamp actuators 403 and 405 installed at both ends thereof. A driving method according to the selective power application of the respective actuators will be described later in detail.

The electrode holder 409 is installed on the drive actuator 406 in order to hold and fix therein the electrode 408. Since the electrode holder 409 is fixed onto the drive actuator 406, the electrode holder 409 and the electrode 408 therein are moved together with the movement of the drive actuator 406.

A driving method for moving an electrode using the micro manipulator 400 having the above-mentioned construction according to a preferred embodiment of the present invention will now be explained with reference to the drawings. FIG. 10 is a table showing an order of applying an electric power to the first and second clamp actuators 403 and 405, and the drive actuator 406, and FIGS. 11 to 16 are views showing a drive order of the respective actuators according to the drive method of the micro manipulator of the present invention. FIG. 10 shows over whether or not to apply an electric power to the respective actuators at the corresponding steps. That is, 'on' indicates a state of application of power to the corresponding actuator, and 'off' indicates a state of cut off of power from the corresponding actuator. For example, at a step 1 in FIG. 10, the first and second clamp actuators 403 and 405 are applied with electric power, and the drive actuator 406 is in cut off state of electric power. Hereinafter, the driving method of the micro manipulator will be explained with reference to the drawings.

First, a main function of the micro manipulator is to move an electrode nearer to or away from the cranial nerve cells. That is, the forward/backward movement of the electrode is the basic and essential function of the micro manipulator. In this context, the procedure of the movement of the electrode by the micro manipulator will now be explained. The basic operation principle of the micro manipulator is characterized in that an electric power is selectively applied to the three actuators to cause the actuators to contract and expand, thereby moving the electrode holder.

Figure 11:
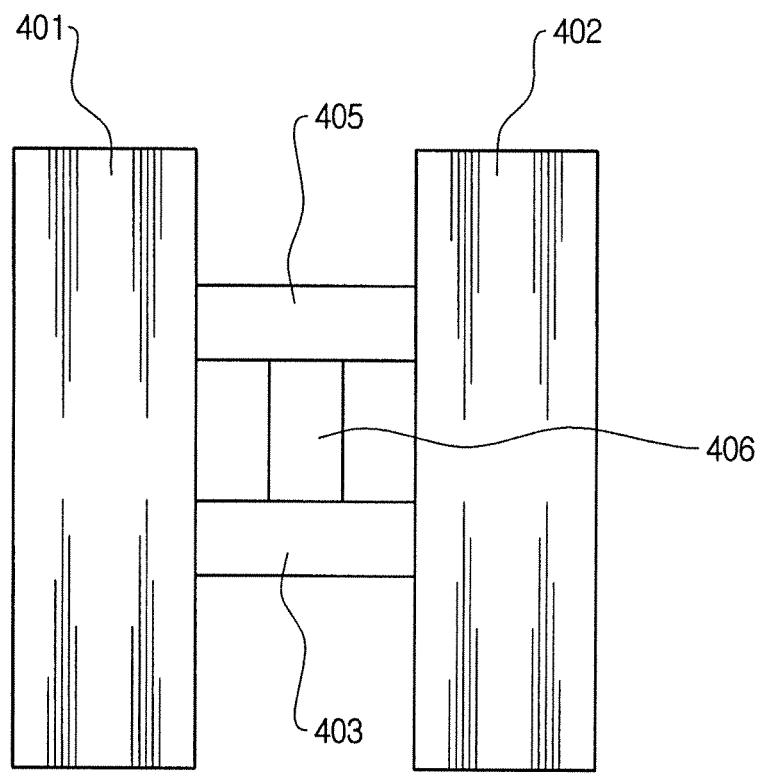
FIGS. 11 to 16 are views showing a drive order of the respective actuators in a drive method of a micro manipulator according to a preferred embodiment of the present invention.

In particular, at an initial state as shown in FIG. 11 corresponding to the step 1 of FIG. 10, among the three actuators 403, 405, and 406, the first and second clamp actuators 403 and 405 are applied with electric power, and the other drive actuator 406 is not applied with electric power. Accordingly, the first and second clamp actuators 403 and 405 expand such that the respective both ends thereof bring in contact with and are fixed to the side faces of the first and second guide members 401 and 402. A term of clamp in the first and second clamp actuators 403 and 405 means that upon the application of electric power, the clamp actuators 403 and 405 are to be closely contacted with and fixed to the first and second guide members 401 and 402.

Figure 12:
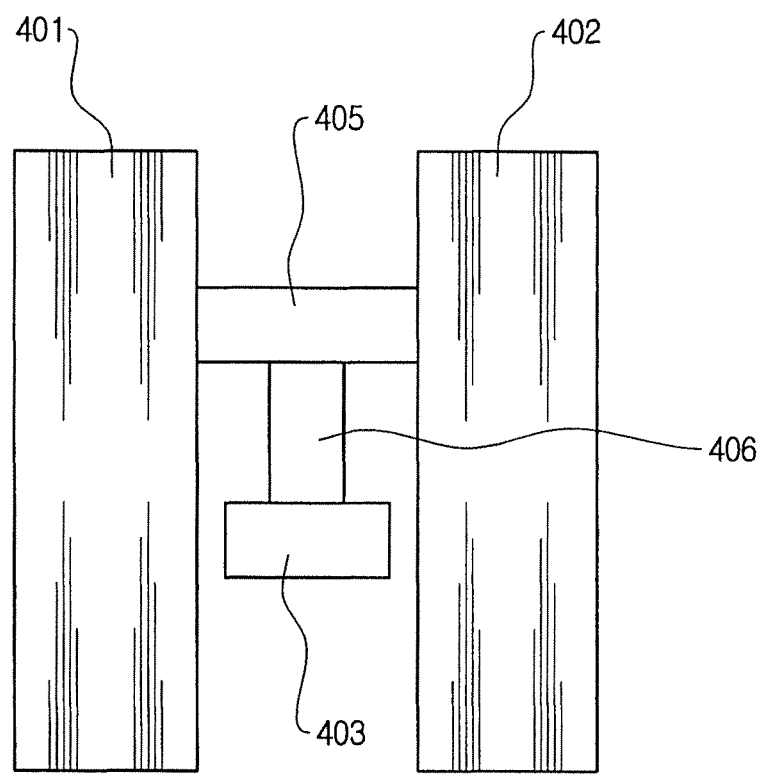

In this state, as shown in FIG. 12 corresponding to a step 2 of FIG. 10, if electric power applied to the first clamp actuator 403 is cut off, the first clamp actuator 403 contracts such that both ends thereof are released from a state of close contact and fixation to the first and second guide members 401 and 402.

Figure 13:
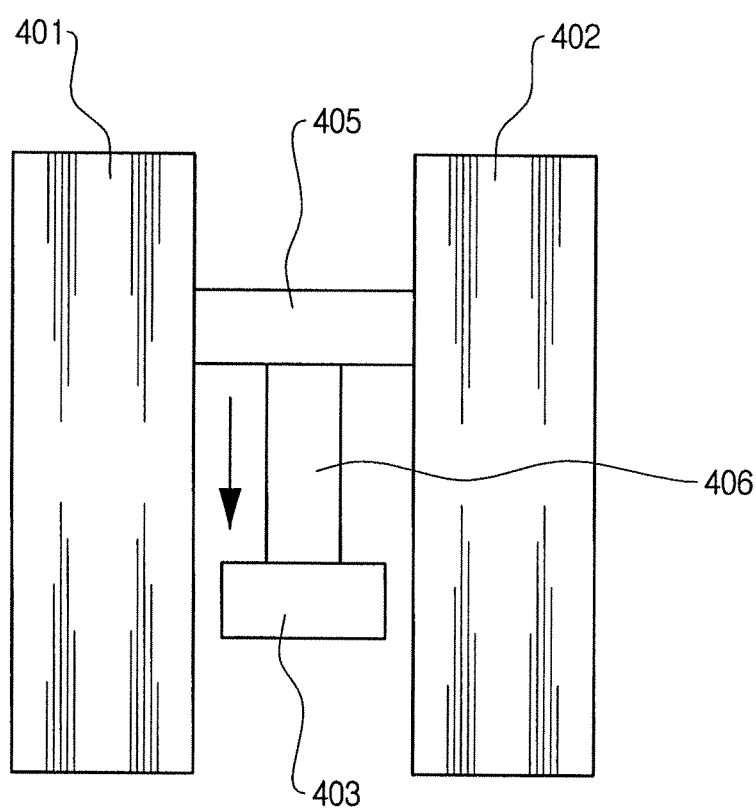

Then, as shown in FIG. 13 corresponding to a step 3 of FIG. 10, if electric power is applied to the drive actuator 406, the drive actuator 406 expands downward in an arrow direction in FIG. 13. In this case, since both ends of the first clamp actuator 403 are separated from the faces of the guide members 401 and 402, the first clamp actuator 403 moves downward in FIG. 13 as the drive actuator 406 expands.

Figure 14:
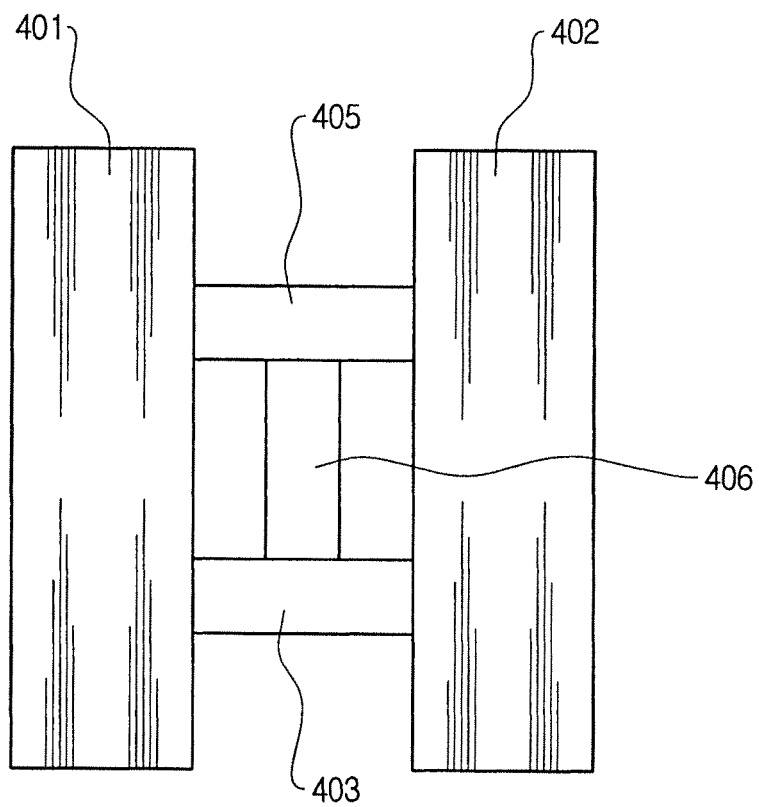

Then, as shown in FIG. 14 corresponding to a step 4 of FIG. 10, if electric power is applied again to the first clamp actuator 403, the first clamp actuator 403 expands such that both ends thereof bring in contact with and are fixed again to the side faces of the first and second guide members 401 and 402.

Figure 15:
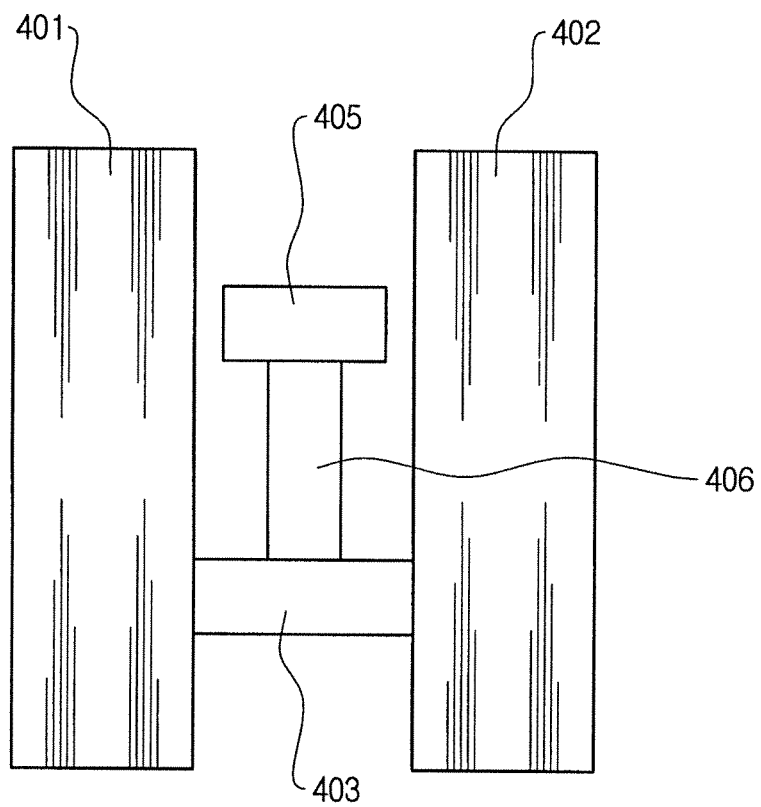

Next, as shown in FIG. 15 corresponding to a step 5 of FIG. 10, if electric power applied to the second clamp actuator 405 is cut off, the second clamp actuator 405 contracts such that both ends thereof are released from a state of close contact and fixation to the first and second guide members 401 and 402.

Figure 16:
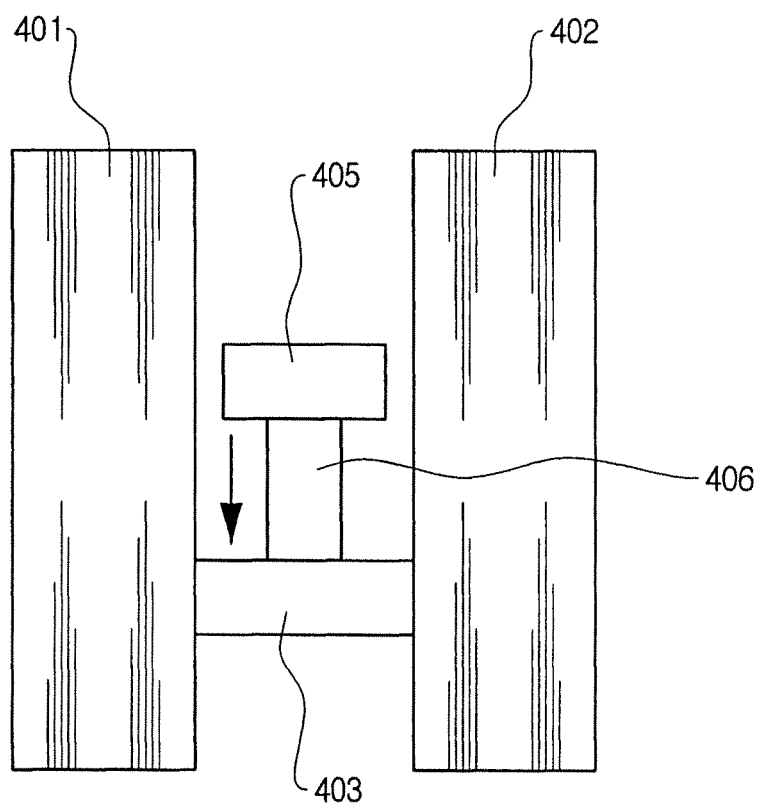

In the state where the second clamp actuator 405 is separated from the side faces of the first and second guide members 401 and 402, as shown in FIG. 16 corresponding to a step 6 of FIG. 10, if electric power applied to the drive actuator 406 is finally cut off, the drive actuator 406 contracts. Accordingly, the drive actuator 406 contracts downward in FIG. 16, and the second clamp actuator 405 and the electrode holder 409 (See FIG. 9) and the electrode 408 held therein move downward together.

As shown in FIGS. 11 to 16, the electrode holder 409 fixed to the drive actuator 406 and the electrode 408 held therein move to a distance, that is, an expansion distance of the drive actuator 406. The movement distance at this time is called a unit movement distance, i.e., a distance resolution. The unit movement distance, i.e., distance resolution, is selectively changeable depending upon the composition material of polymer compounding the actuators, the magnitude of applied power, and others. The unit movement distance, or the distance resolution of the micro manipulator 400 of the present invention can reach up to several tens to hundreds nm.

FIGS. 11 to 16 have shown an operation of the downward movement of the electrode 408, and the upward movement of the electrode can be implemented through the inverse process of FIGS. 11 to 16.

Meanwhile, as the first and second clamp actuators, other flat electrostatic clamp actuators can be used instead of the actuators using polymer. That is, while the polymer clamp of the present invention thermally expands to contact the guide member to clamp the same, the flat electrostatic clamp generates an electrostatic force with the application of specified voltage between a flat electrode and the guide surface to bring the guide and the clamp actuator in close contact with each other. Accordingly, the flat electrostatic clamp actuator can be used as the first and second clamp actuators. Moreover, the micro manipulator using the flat electrostatic clamp actuator can be driven according to the driving method of FIGS. 11 to 16.

In the mean time, in the micro manipulator of the present invention, since the three actuators are placed inside the guide members so that upon the application of voltage to the actuators, a minute mechanical force may be possibly exerted by the guide members, it is required a precise assembly between the three actuators and the guide members.

Although the present invention has illustrated only a micro manipulator of a measurement device of a cranial nerve signal as an embodiment using a polymer linear actuator, such embodiment using the polymer linear actuator is not limited thereto, but may adapted to a compact size device such as a micro robot, for example, requiring an independent drive source.

As set forth before, a polymer linear actuator according to the present invention can generate a displacement greater than the conventional MEMS type actuator by its simple structure.

Moreover, since a polymer linear actuator of the present invention is driven by thermal expansion of polymer, a greater driving force can be realized relative to the conventional MEMS type actuator.

Furthermore, a polymer linear actuator according to the present invention can obtain a reliable linear displacement through the existing MEMS process and a structure proposed, and be manufactured through the MEMS process, thereby accomplishing the cost reduction through mass production and the miniaturization.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A polymer linear actuator for a micro electro mechanical system (MEMS), comprising:
   first and second bodies positioned spaced apart to a distance from each other;
   bar type polymer connection parts connecting the first and second bodies together;
   silicon drive members disposed in a trapezoidal shape along the polymer connection parts;
   a resistor part applying heat to the polymer connection parts; and
   a power supply for supplying electric power to the resistor part,
   wherein the polymer connection parts expand or contract in response to the heat selectively applied from the resistor part to cause the first and second bodies to move linearly.

2. The polymer linear actuator as claimed in claim 1, wherein the silicon members are connected to the polymer connection parts by connection means including at least one wedge protrusion provided on the polymer connection parts contacting the silicon members and at least one recess provided on the silicon members and corresponding to the shape of the protrusions, such that the protrusions are inserted into the recesses to connect the silicon members and the polymer connection parts together.

3. A micro manipulator of a brain signal measuring device for linearly moving an electrode for detecting an electric signal of the brain neurons or applying an electric signal to the brain neurons, the micro manipulator comprising:
   first and second guide members spaced a distance from each other;
   first and second clamp actuators spaced to a distance between the first and second guide members and installed perpendicular to a movement direction of the electrode; and
   a drive actuator installed parallel to the movement direction of the electrode and between the first and second clamp actuators,
   wherein the first clamp actuator, the second clamp actuator, and the drive actuator are each a polymer linear actuator comprising:
      first and second bodies positioned spaced apart to a distance from each other;
      bar type polymer connection parts connecting the first and second bodies together;
      silicon drive members disposed in a trapezoidal shape along the polymer connection parts;
      a resistor part applying heat to the polymer connection parts; and
      a power supply for supplying electric power to the resistor part,
      wherein the polymer connection parts expand or contract in response to the heat selectively applied from the resistor part to cause the first and second bodies to move linearly.

* * * * *